USOO5851284A

United States Patent [19]
Ishibashi et al.

[11] Patent Number: 5,851,284
[45] Date of Patent: Dec. 22, 1998

[54] PROCESS FOR PRODUCING GARNET SINGLE CRYSTAL

[75] Inventors: Shigeo Ishibashi, Zama; Itaru Yokohama, Isehara; Yuzo Ishida, Tokyo; Kazunori Naganuma, Isehara, all of Japan

[73] Assignee: Nippon Telegraph and Telephone Corporation, Tokyo, Japan

[21] Appl. No.: 751,700

[22] Filed: Nov. 18, 1996

[30]    Foreign Application Priority Data

Nov. 21, 1995  [JP]  Japan .................................. 7-302879

[51] Int. Cl.⁶ ..................................................... C30B 15/36
[52] U.S. Cl. ................................ 117/35; 117/36; 117/902
[58] Field of Search ............................... 117/13, 19, 36, 117/945, 35, 902

[56]    References Cited

U.S. PATENT DOCUMENTS

| 3,607,390 | 9/1971 | Comstock, et al. | ....................... | 117/8 |
| 4,421,721 | 12/1983 | Byer et al. | ............................. | 117/202 |

FOREIGN PATENT DOCUMENTS 57-56399A  4/1982  Japan .

OTHER PUBLICATIONS

"Macroscopic strain in facetted regions of garnet crystals", B. Cockayne et al, Journel of Materials Sciences 8, (1973), pp. 382–384.

"Pulling Optical Fibers", R.S. Feigelson, Journal of Crystal Growth 79 (1986), pp. 669–680.

Single–crystal fiber optical devices: A Nd:YAG fiber laser, C.A. Burrus et al, Applied Physics Letters, vol. 26, No. 6, Mar. 15, 1975, pp. 318–320.

*Primary Examiner*—Felisa Garrett
*Attorney, Agent, or Firm*—Spencer & Frank

[57]    ABSTRACT

According to the process of the present invention for producing a garnet single crystal fiber, a crystal is grown while the direction of a seed crystal, corresponding to the direction of growth, is set in a direction having angles of at least 10° from a direction equivalent to the <100> orientation, at least 20° from a direction equivalent to the <110> orientation and at least 20° from a direction equivalent from the <211> orientation. The resulting garnet single crystal fiber does not include a core, which is formed due to facet formation, and has an excellent optical homogeneity necessary for use in an optical device such as a laser device or an isolator.

12 Claims, 5 Drawing Sheets

PROCESS FOR PRODUCING GARNET SINGLE CRYSTAL

BACKGROUND OF THE INVENTION

1. Field of the Invention

The present invention relates to a process for producing a garnet single crystal fiber for use in an optical device such as a laser device or an isolator.

2. Description of Related Art

The optical homogeneity of a garnet single crystal fiber for use in an optical device such as a laser fiber for use in an optical device such as a laser device or an isolator greatly affects the performance thereof. If a refractive index-varied portion, i.e., a core, is formed due to facet formation in the (211), (110) or (100) plane of a crystal being formed, the optical homogeneity of the resulting crystal is lowered to thereby lower the performance of the device made of the crystal. This problem will be described by taking a garnet single crystal fiber for use in an optical device such as a laser fiber for use in a solid state laser as an example.

Since a laser activator generally releases part of its excitation energy as heat in a solid state laser, the temperature of a laser rod rises during excitation as compared with that before excitation. Since the luminescent efficiency of the laser activator decreases in keeping with its temperature rise, sufficient heat dissipation from the laser rod is important as a condition of efficient laser oscillation. A fibrous rod of at most about 500 μm in diameter has a short distance from the central portion thereof, where an excited laser activator is in existence, to the peripheral cooling portion of the rod as compared with a standardized rod of about 5 mm in diameter, which is advantageous for efficient heat dissipation. Thus, a single crystal fiber is necessary for use in a laser.

According to a conventional process for producing a garnet single crystal fiber for use in an optical device such as a laser fiber for use in a laser, a crystal 13 being formed is pulled upward using a seed crystal 14 having the <100> or <111> orientation thereof directed in the direction of growth. The growth method is the laser-heated melt growth method-or the like as shown in FIG. 4. In this case, a facet in the (211), (110) or (100) plane develops in part 23 of the solid-liquid interface of the crystal 13 to thereby form a refractive index-varied portion, i.e., a core. This is the same phenomenon as has hitherto been observed in a crystal being formed by the Czochralski method. The variation of refractive index is said to be caused by lattice distortion (see B. Cockayne et al., J. Material Science 8 (1973) p. 382).

FIG. 5 shows a photomicrograph of a section of the formed crystal 13 through a crossed-Nicols polarizing microscope. Rotation of the polarization occurred because of birefringence 30 caused by the variation of refractive index, whereby the core was observed. When a light was transmitted through the formed crystal 13, the light was scattered by the core and the laser oscillation properties of the crystal were therefore very poor. For example, in the case of a laser constituted of a fiber of yttrium-aluminum garnet doped with calcium and chromium (molecular formula: Cr, Ca:$Y_3$ $Al_5$ $O_{12}$; hereinafter referred to in brief as "Cr, Ca:YAG"), a single crystal fiber grown in the direction of the <100> orientation, wherein a gain is larger than in the direction of the <111> orientation, was incorporated into a laser device, and then excited with a light of 1.06 μm in wavelength and 10 W in intensity, resulting in a failure in oscillation because scattering of the light in the rod was strong.

The foregoing process for producing a garnet single crystal fiber involves a problem with the optical quality of a crystal fiber because a refractive index-varied portion, i.e., a core, is formed due to facet formation in the (211), (110) or (100) plane in part of a crystal being formed. An object of the present invention is to provide a process for producing a core-free garnet single crystal fiber.

SUMMARY OF THE INVENTION

The feature of the present invention is that a crystal being formed is grown while the direction of a seed crystal, corresponding to the direction of growth, is set in a direction having angles of at least 10° from a direction equivalent to the <100> orientation, at least 20° from a direction equivalent to the <110> orientation and at least 20° from a direction equivalent to the <211> orientation.

In the first aspect of the present invention, a process for producing a single crystal having a garnet structure comprising: bringing a seed crystal into contact with a melt of a crystal having a garnet structure, and pulling said seed crystal upward to grow a single crystal, wherein the pull-up direction of said seed crystal is set in a direction falling within a specific range apart from a direction crystallographically equivalent to a <100> orientation of said seed crystal at an angle of at least 10°, from a direction crystallograhically equivalent to a <110> orientation thereof at an angle of at least 20° and from <211> orientation thereof at an angle of at least 20°.

Here, the crystal having a garnet structure may be an yttrium-aluminum garnet.

The crystal having a garnet structure may be any one of a yttrium-scandium-aluminum garnet (molecular formula: $Y_3$ $Sc_x$ $Al_{5-x}$ $O_{12}$): a yttrium-gallium-aluminum garnet (molecular formula: $Y_3$ $Ga_x$ $Al_{5-x}$ $O_{12}$), a lutetium-aluminum garnet (molecular formula: $Lu_3$ $Al_5$ $O_{12}$), and an yttrium-iron garnet (molecular formula: $Y_3$ $Fe_5$ $O_{12}$).

In the second aspect of the invention, a process for producing a single crystal having a garnet structure comprising: melting a tip portion of a source rod formed of a crystal having a garnet structure, bringing a seed crystal into contact with said molten tip portion, and pulling said seed crystal upward to grow a fibrous single crystal;

wherein the pull-up direction of said seed crystal is set in agreement with a direction falling within a specific range apart from a direction crystallographically equivalent to a <100> orientation of said seed crystal at an angle of at least 10°, from a direction crystallographically equivalent to a <110> orientation thereof at an angle of at least 20° and from a direction crystallographically equivalent to a <211> orientation thereof at an angle of at least 20°.

Here, the crystal having a garnet structure may be a yttrium-aluminum garnet.

The crystal having a garnet structure may be any one of a yttrium-scandium-aluminum garnet (molecular formula: $Y_3$ $Sc_{cx}$ $Al_{5-x}$ $O_{12}$), an yttrium-gallium-aluminum garnet (molecular formula: $Y_3$ $Ga_x$ $Al_5$ $O_{12}$), a lutetium-aluminum garnet (molecular formula: $Lu_3$ $Al_{5-x}$ $O_{12}$), and a yttrium-iron garnet (molecular formula: $Y_3$ $Fe_5$ $O_{12}$), In the third aspect of the present invention, a process for producing a single crystal having a garnet structure comprising: bringing a seed crystal into contact with a melt of a crystal having a garnet structure and contained in a crucible, and pulling said seed crystal upward while revolving said seed crystal to effect growth of a rod-like single crystal;

wherein the pull-up direction of said seed crystal is set in agreement with a direction falling within a specific range apart from a direction crystallographically equivalent to a <100> orientation of said seed crystal at an angle of at least 10°, from a direction crystallographically equivalent to a <110> orientation thereof at an angle of at least 20° and from a direction crystallographically equivalent to a <211> orientation thereof at an angle of at least 20°.

Here, the crystal having a garnet structure may be a yttrium-aluminum garnet.

The crystal having a garnet structure may be any one of a yttrium-scandium-aluminum garnet (molecular formula: $Y_3 Sc_x Al_{5-x} O_{12}$), an yttrium-gallium-aluminum garnet (molecular formula: $Y_3 Ga_x Al_{5-x} O_{12}$), a lutetium-aluminum garnet (molecular formula: $Lu_3 Al_5 O_{12}$), and a yttrium-iron garnet (molecular formula: $Y_3 Fe_5 O_{12}$), The above and other objects, effects, features and advantages of the present invention will become more apparent from the following description of the embodiments thereof taken in conjunction with the accompanying drawings.

DETAILED DESCRIPTION OF PREFERRED EMBODIMENTS

When the direction of growth of a garnet crystal is in the <100> or <111> orientation, the solid-liquid interface has a small angle with the facet planes of (211), (110) or (100) whereby a core appears because of facet formation. By contrast, according to the present invention, a crystal is grown in a direction having angles of at least 10° from a direction equivalent to the <100> orientation, at least 20° from a direction equivalent to the <110> orientation and at least 20° from a direction equivalent to the <211> orientation, and the solid-liquid interface between a crystal being formed and a melt portion has sufficiently large angles with the (211), (110) and (100) planes, which bring about no facet formation. Thus, a core-free garnet single crystal fiber of excellent optical quality can be obtained according to the present invention.

Figure 1:
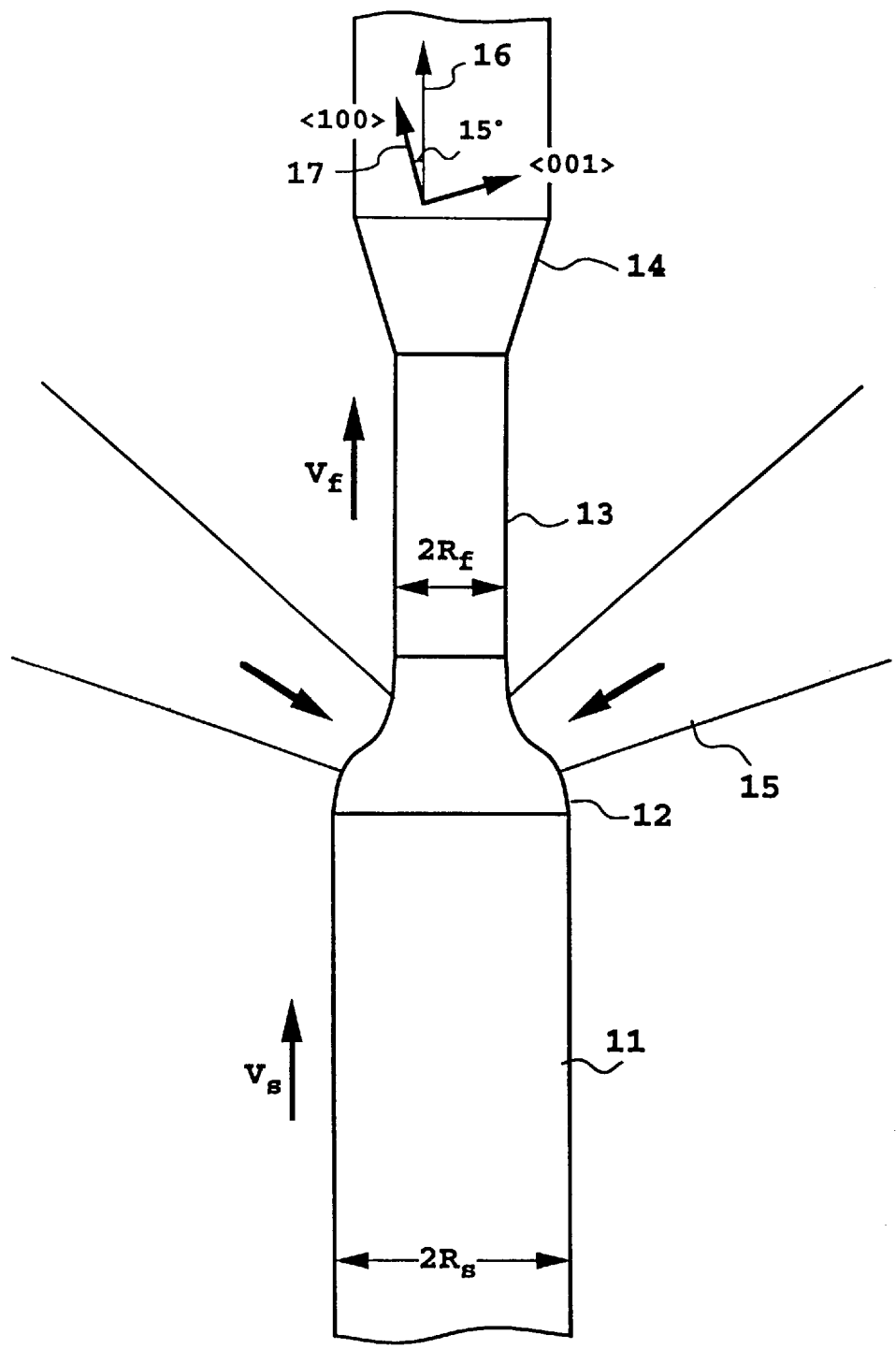
FIG. 1 is a model diagram showing a process for producing a garnet single crystal fiber by the laser-heated melt growth method according to the present invention.

The outline of the process of the present invention for producing a garnet single crystal fiber is shown in the model diagram of FIG. 1. In this example, a description will be made of a case where Cr,Ca:YAG is produced according to the laser-heated melt growth method. A single YAG crystal having calcium oxide and chromium oxide vacuum-deposited on the surface thereof is used as a source rod 11. A top portion of the source rod is heated and melted with $CO_2$ laser beams 15. A YAG seed crystal 14 is brought into contact with the melt portion 12. When the seed crystal 14 is moved upward, a single Cr,Ca:YAG crystal fiber 13 is grown.

The radius Rf of the grown crystal is determined according to the following equation:

$$Rf = Rs(Vs/Vf)^2$$

wherein Rs is the radius of the source rod, Vf is a pull-up velocity of the seed crystal, and Vs is the delivery velocity of the source rod. The above-mentioned factors are adjusted in such a way as to provide a value Rf of at most 500 µm. The crystallographic orientations of the single crystal fiber 13 become identical with the crystallographic orientations of the seed crystal 14. A crystallographic orientation of the seed crystal 14, relative to the direction of growth, is set in a direction 16 which is perpendicular to the <001> orientation and has an angle of 15° with the <100> orientation. In a crystal grown in this growth direction 16, a core, which is formed because of facet formation, was not formed, whereby the crystal was excellent in optical homogeneity. Additionally stated, the numeral 17 indicates the direction of a crystallographic axis.

Figure 6:
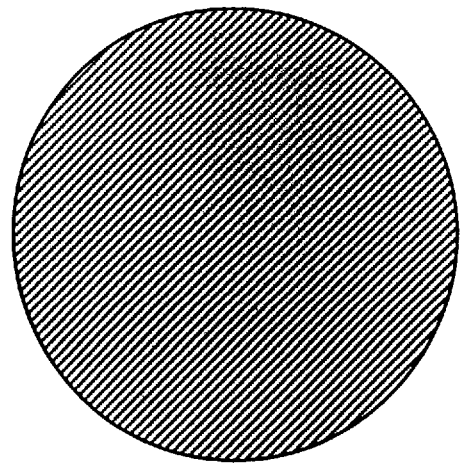
FIG. 6 is a photomicrograph of a garnet crystal formed according to the process of the present invention through a crossed-Nicols polarizing microscope.

FIG. 6 shows a photomicrograph of a section of the formed crystal 13 through a crossed-Nicols polarizing microscope. Birefringence due to any refractive index variation was not observed at all. The grown crystal was used to constitute a laser oscillator, in which laser oscillation occurred in the range of wavelength of 1.34 µm to 1.58 µm with an excitation light of 1.06 µm in wavelength. At an oscillation wavelength of 1.45 µm, the threshold value was 0.3 W and the slope efficiency was 50%. The effect of the present invention will be apparent in view of the fact that no oscillation occurs in the case of a crystal formed by the conventional process.

Figure 2:
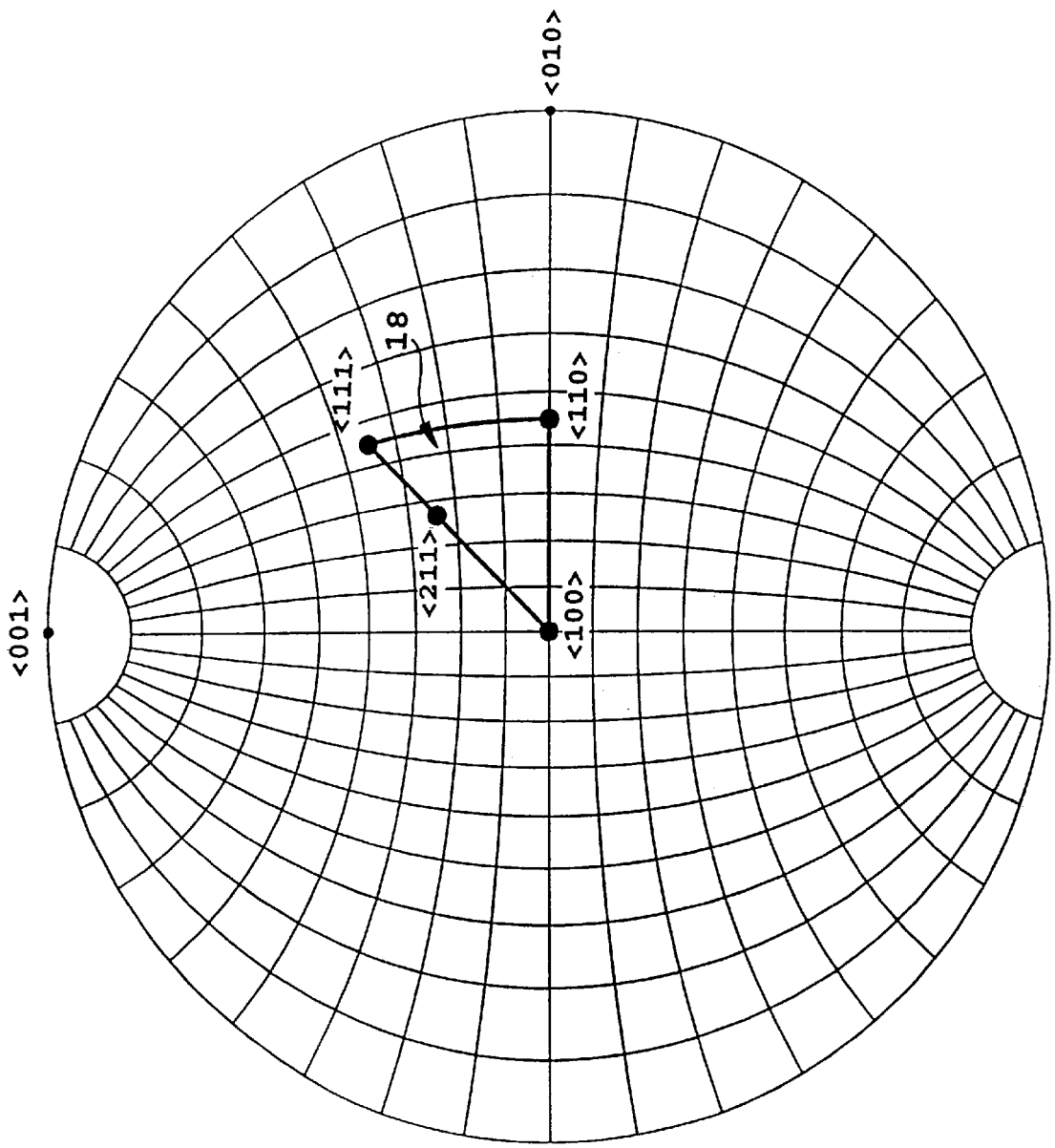
FIG. 2 is a diagram showing the direction of growth of a crystal being pulled upward according to the present invention.
Figure 3:
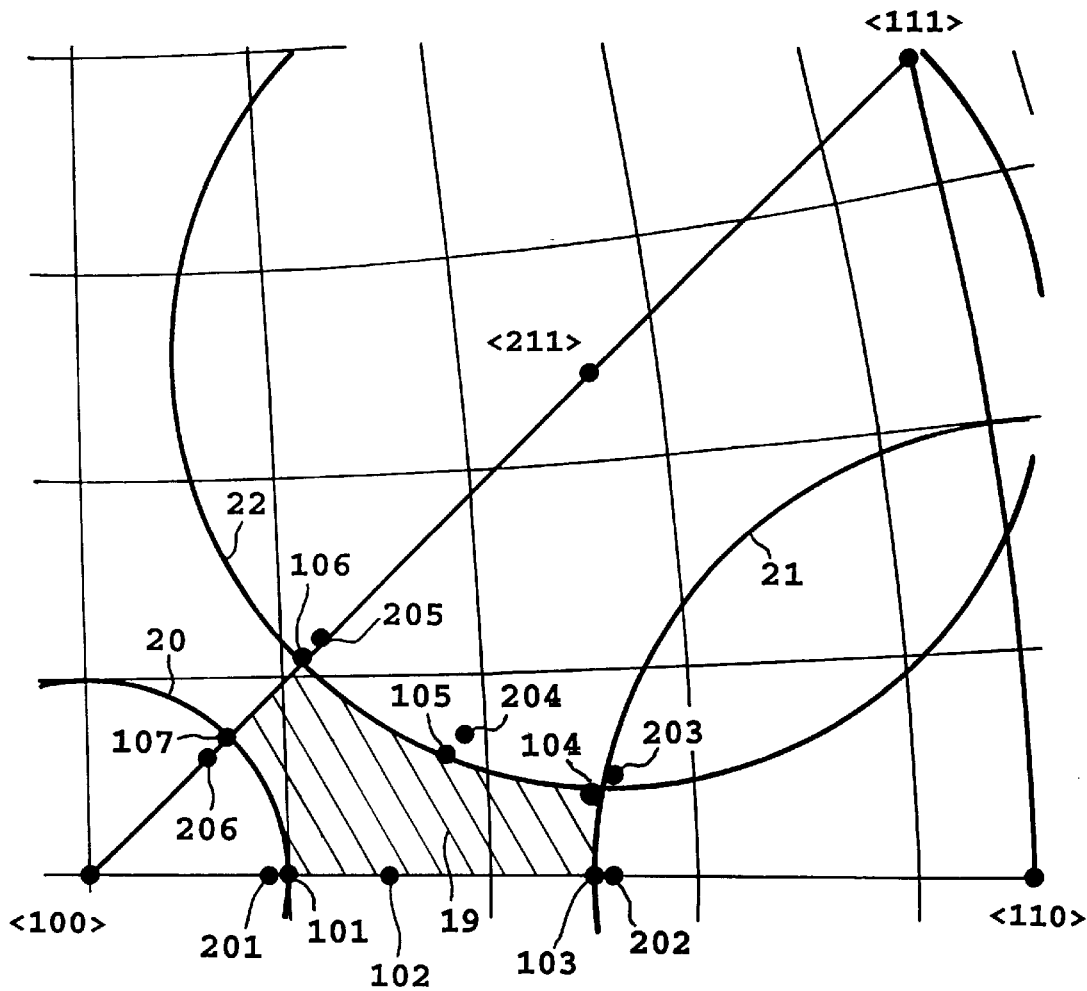
FIG. 3 is a diagram showing the direction of growth of a crystal being pulled upward according to the present invention.
Figure 4:
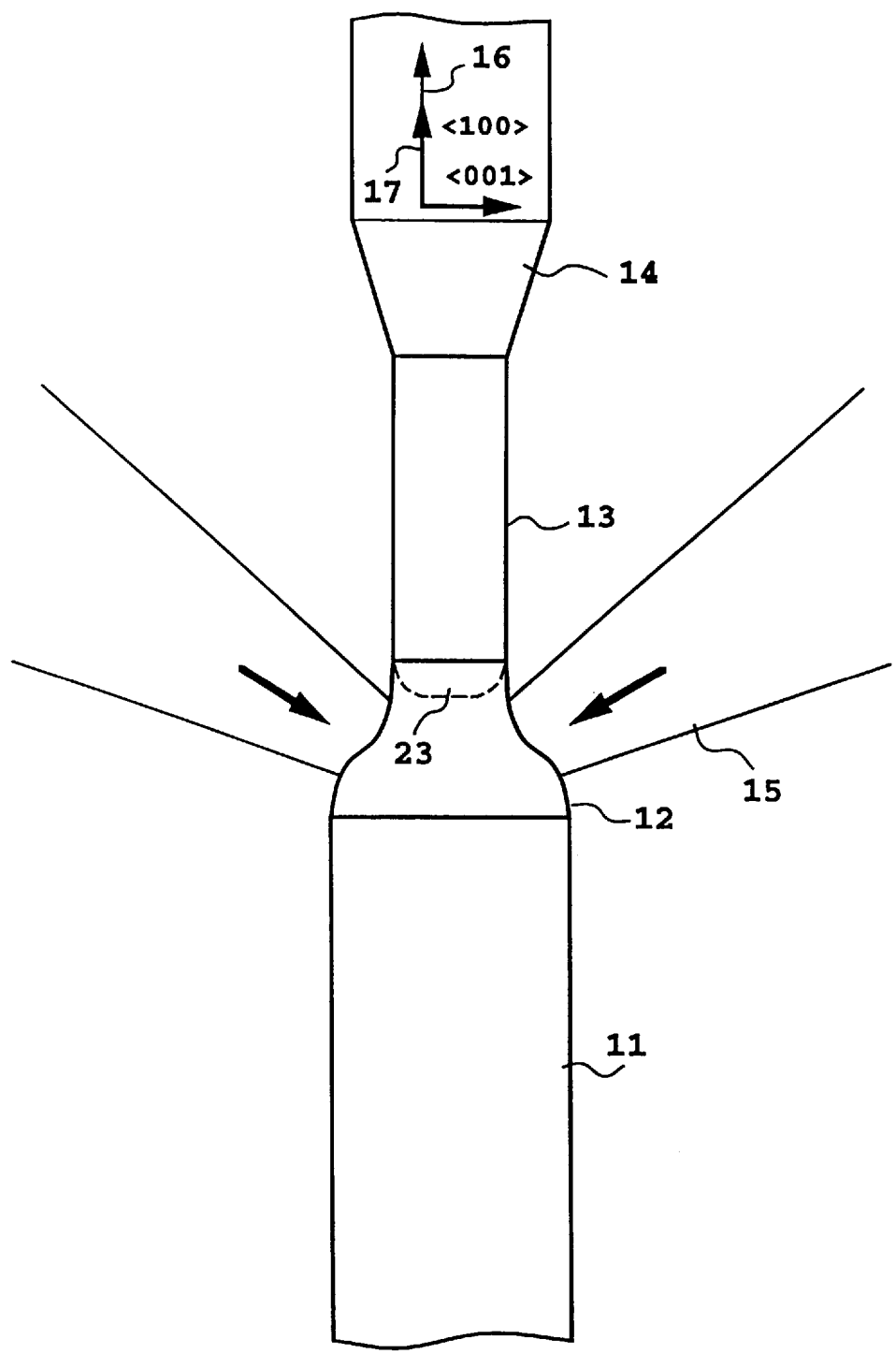
FIG. 4 is a diagram showing a conventional process for producing a garnet single crystal fiber by the laser-heated melt growth method.
Figure 5:
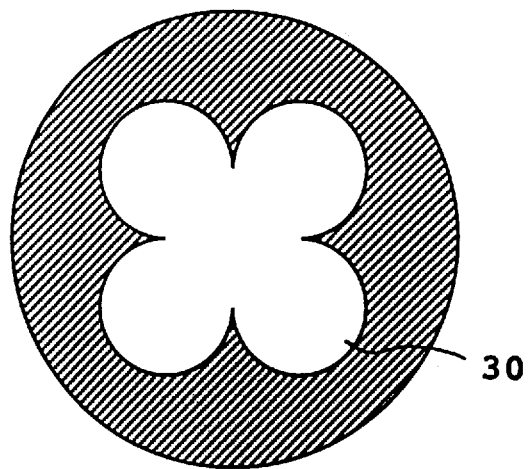
FIG. 5 is a photomicrograph of a garnet crystal formed according to the conventional process through a crossed-Nicols polarizing microscope.

The results of the crystal growth in the directions other than those in the foregoing example are shown in a stereo projection. It is sufficient to examine only the objective area 18 surrounded by the thick frame in FIG. 2, considering to the symmetry of garnet, which is Ia3d. Other orientations have equivalent directions in the objective area. FIG. 3 is an enlarged diagram of the objective area, wherein the growth directions resulting in no core are represented by the slash-marked area 19.

First, the growth directions represented by the points 101 to 107, including the point in the foregoing example, were examined to confirm no core formation. These directions are (θ, ø)=(90°, 10°), (90°, 15°), (90°, 25°), (86°, 25°), (84°, 18°), (79°, 11°), and (83°, 7°), wherein θ is an angle with the <001> orientation and ø is an angle with the (010) plane. On the other hand, when pull-up was done in any one of the directions (θ, ø)=(90°, 9°), (90°, 26°), (85°, 26°), (83°, 19°), (78°, 12°), and (84°, 6°) as represented by the points 201 to 206 in FIG. 3, core was formed. As a result of further examination of growth directions as represented by points around the above-mentioned points, no core formation was confirmed when the growth direction had angles of at least 10° from the <100> orientation, at least 20° from the <110> orientation and at least 20° from the <211> orientation (in the slash-marked area 19).

The following Tables 1 and 2 respectively show the growth directions without core formation and the growth directions with core formation, corresponding to the points shown in FIG. 3.

TABLE I

Directions of Growth without Core Formation

| Number | (θ,ø) |
|---|---|
| 101 | (90°,10°) |
| 102 | (90°,15°) |
| 103 | (90°,25°) |
| 104 | (86°,25°) |
| 105 | (84°,18°) |
| 106 | (79°,11°) |
| 107 | (83°,7°) |

TABLE 2

Directions of Growth with Core Formation

| Number | (θ, ) |
|---|---|
| 201 | (90°,9°) |
| 202 | (90°,26°) |
| 203 | (85°,26°) |
| 204 | (83°,19°) |
| 205 | (78°,12°) |
| 206 | (84°,6°) |

Additionally stated, in FIG. 3, the numeral 20 refers to a line showing directions having an angle of 10° with the <100> orientation, 21 to a line showing directions having an angle of 20° with the <110> orientation, and 22 to a line showing directions having an angle of 20° with the <211> orientation.

In a conventional case where the growth direction is the <100> or <111> orientation, the solid-liquid interface between a crystal being grown and a melt portion has a small angle with the (211), (110) or (100) plane in which facet is formed, whereby facet formation occurs to develop a core. By contrast, according to the present invention, a crystal is grown in a direction having angles of at least 10° from a direction equivalent to the <100> orientation, at least 20° from a direction equivalent to the <110> orientation and at least 20° from a direction equivalent to the <211> orientation, whereby the solid-liquid interface has sufficient big angles with the (211), (110) and (100) plane to bring about no facet formation. Accordingly, a core-free garnet single crystal fiber of excellent optical quality can be produced.

The process of the present invention was effective in growing a YAG single crystal fiber with no dopants and a YAG single crystal-fiber doped with other dopant elements, such as neodymium, besides Cr,Ca:YAG. Further, yttrium-scandium-aluminum garnet (molecular formula: $Y_3 Sc_x Al_{5-x} O_{12}$) single crystal fibers, yttrium-gallium-aluminum garnet (molecular formula: $Y_3 Ga_x Al_{5-x} O_{12}$) single crystal fibers, lutetium-aluminum garnet (molecular formula: $Lu_3 Al_5 O_{12}$) single crystal fibers, and yttrium-iron garnet (molecular formula: $Y_3 Fe_5 O_{12}$) single crystal fibers were pulled upward in the growth directions 101 to 107 to bring about no core formation as well.

The process of the present invention is of course applicable to produce garnet single crystal fibers other than those as mentioned hereinabove. It is also applicable to the production of not only a garnet single crystal fiber for use in a solid state laser but also a garnet single crystal fiber for use in other optical elements, such as an isolator. Further, the process of the present invention was employed for growth of a YAG single crystal fiber (diameter: 500 µm) by means of the Czochralski method to bring about no core formation. The process of the present invention also is of course employable for growth of a garnet single crystal fiber by means of pull-up methods other than the laser-heated melt growth method and the Czochralski method.

As described hereinbefore, by means of the process of the present invention for producing a garnet single crystal fiber, since a crystal is grown by setting a seed crystal, corresponding to the growth direction, in a direction having angles of at least 10° from a direction equivalent to the <100> orientation, at least 20° from a direction equivalent to the <110> orientation and at least 20° from a direction equivalent to the <211> orientation, the resulting garnet single crystal fiber is free of core, which is formed due to facet formation, and is therefore excellent in optical homogeneity.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. A process for producing a single crystal having a garnet structure comprising: bringing a seed crystal into contact with a melt of a crystal having a garnet structure, and pulling said seed crystal upward to grow a single crystal,
   wherein the pull-up direction of said seed crystal is set in a direction falling within a specific range apart from a direction crystalloaraphically equivalent to a <100> orientation of said seed crystal at an angle of at least 10°, from a direction crystalloqraphically equivalent to a <110> orientation thereof at an angle of at least 20° and from a direction crystalloqraphically equivalent to a <211> orientation thereof at an angle of at least 20°.

2. A process for producing a single crystal having a garnet structure as claimed in claim 1, wherein said crystal having a garnet structure is a yttrium-aluminum garnet.

3. A process for producing a single crystal having a garnet structure as claimed in claim 1, wherein said crystal having a garnet structure is any one of a yttrium-scandium-aluminum garnet (molecular formula: $Y_3 Sc_x Al_{5-x} O_{12}$): a yttrium-gallium-aluminum garnet (molecular formula: $Y_3 Ga_x Al_{5-x} O_{12}$), a lutetium-aluminum garnet (molecular formula: $Lu_3 Al_5 O_{12}$), and a yttrium-iron garnet (molecular formula: $Y_3 Fe_5 O_{12}$).

4. A single crystal having a garnet structure produced by the process of claim 1.

5. A process for producing a single crystal having a garnet structure comprising: melting a tip portion of a source rod formed of a crystal having a garnet structure, bringing a seed crystal into contact with said molten tip portion, and pulling said seed crystal upward to grow a fibrous single crystal;
   wherein the pull-up direction of said seed crystal is set in a direction falling within a specific range apart from a direction crystallographically equivalent to a <100> orientation of said seed crystal at an angle of at least 10°, from a direction crystallographically equivalent to a <110> orientation thereof at an angle of at least 20° and from a direction crystallographically equivalent to a <211> orientation thereof at an angle of at least 20°.

6. A process for producing a single crystal having a garnet structure as claimed in claim 5, wherein said crystal having a garnet structure is a yttrium-aluminum garnet.

7. A process for producing a single crystal having a garnet structure as claimed in claim 5, wherein said crystal having a garnet structure is any one of a yttrium-scandium-aluminum garnet (molecular formula: $Y_3 Sc_x Al_{5-x} O_{12}$), a yttrium-gallium-aluminum garnet (molecular formula: $Y_3 Ga_x Al_5 O_{12}$), a lutetium-aluminum garnet (molecular formula: $Lu_3 Al_{5-x} O_{12}$), and a yttrium-iron garnet (molecular formula: $Y_3 Fe_5 O_{12}$).

8. A single crystal having a garnet structure produced by the process of claim 5.

9. A process for producing a single crystal having a garnet structure comprising: bringing a seed crystal into contact with a melt of a crystal having a garnet structure and contained in a crucible, and pulling said seed crystal upward while revolving said seed crystal to effect growth of a rod-like single crystal;

wherein the pull-up direction of said seed crystal is set in agreement with a direction falling within a specific range apart from a direction crystallographically equivalent to a <100> orientation of said seed crystal at an angle of at least 10°, from a direction crystallographically equivalent to a <110> orientation thereof at an angle of at least 20° and from a direction crystalloqraphically equivalent to a <211> orientation thereof at an angle of at least 20°.

10. A process for producing a single crystal having a garnet structure as claimed in claim 9, wherein said crystal having a garnet structure is a yttrium-aluminum garnet.

11. A process for producing a single crystal having a garnet structure as claimed in claim 9, wherein said crystal having a garnet structure is any one of a yttrium-scandium-aluminum garnet (molecular formula: $Y_3 Sc_x Al_{5-x} O_{12}$), a yttrium-gallium-aluminum garnet (molecular formula: $Y_3 Ga_x Al_{5-x} O_{12}$), a lutetium-aluminum garnet (molecular formula: $Lu_3 Al_5 O_{12}$), and a yttrium-iron garnet (molecular formula: $Y_3 Fe_5 O_{12}$).

12. A single crystal having a garnet structure produced by the process of claim 9.

* * * * *